(12) United States Patent
Wang

(10) Patent No.: US 8,132,320 B2
(45) Date of Patent: Mar. 13, 2012

(54) CIRCUIT BOARD PROCESS

(75) Inventor: Chien-Hao Wang, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 434 days.

(21) Appl. No.: 12/433,436

(22) Filed: Apr. 30, 2009

(65) Prior Publication Data

US 2009/0294027 A1  Dec. 3, 2009

(30) Foreign Application Priority Data

May 29, 2008 (TW) ................ 97119946 A

(51) Int. Cl.
*H05K 3/02* (2006.01)
*H05K 3/10* (2006.01)
*H05K 1/00* (2006.01)
*H01R 43/00* (2006.01)

(52) U.S. Cl. .............. 29/846; 29/825; 174/250

(58) Field of Classification Search .......... 29/825, 29/831, 832, 842, 846, 847, 848, 852; 174/250, 174/251, 255, 256, 258, 259, 260, 261, 262, 174/263

See application file for complete search history.

(56) References Cited

U.S. PATENT DOCUMENTS

| | | | | |
|---|---|---|---|---|
| 4,643,935 A * | 2/1987 | McNeal et al. | ............... | 428/157 |
| 5,262,594 A * | 11/1993 | Edwin et al. | ................. | 174/254 |
| 5,667,393 A * | 9/1997 | Grabbe et al. | ................ | 600/443 |
| 5,784,782 A * | 7/1998 | Boyko et al. | .................... | 29/848 |
| 6,066,386 A * | 5/2000 | Boyko et al. | .................... | 428/209 |
| 6,188,579 B1 * | 2/2001 | Buondelmonte et al. | ...... | 361/719 |
| 6,214,525 B1 * | 4/2001 | Boyko et al. | ................. | 430/313 |
| 6,316,732 B1 * | 11/2001 | Lim | ............................. | 174/255 |
| 6,664,864 B2 * | 12/2003 | Jiles et al. | ..................... | 331/176 |
| 6,777,268 B2 * | 8/2004 | Jiang | ............................ | 438/118 |
| 7,061,119 B1 * | 6/2006 | Jiang | ............................ | 257/777 |
| 7,112,885 B2 * | 9/2006 | Chen et al. | .................... | 257/728 |
| 7,596,863 B2 * | 10/2009 | Bhatt et al. | ....................... | 29/852 |
| 7,864,113 B2 * | 1/2011 | Pinel et al. | ............ | 343/700 MS |
| 7,977,163 B1 * | 7/2011 | Huemoeller et al. | ......... | 438/125 |
| 2008/0142254 A1 * | 6/2008 | Wang et al. | .................... | 174/259 |

* cited by examiner

*Primary Examiner* — David Angwin
(74) *Attorney, Agent, or Firm* — J.C. Patents

(57) ABSTRACT

A circuit board process is provided. In the circuit board process, a first substrate and a second substrate are stacked to form a cavity for accommodating chips. The top of the cavity is covered by a third metal layer that serves as a mask. The first substrate has a base, a first metal layer, a second metal layer, and at least a first conductive structure, and the first metal layer is patterned to form a first circuit layer having a number of first pads. The second substrate, at least an insulation layer and a third metal layer are laminated to the first substrate with a common opening in-between, and the third metal layer covers the common opening. A third circuit layer having a number of third pads is formed on the second substrate. The first pads and the third pads are not on a same plane for wire bonding.

10 Claims, 9 Drawing Sheets

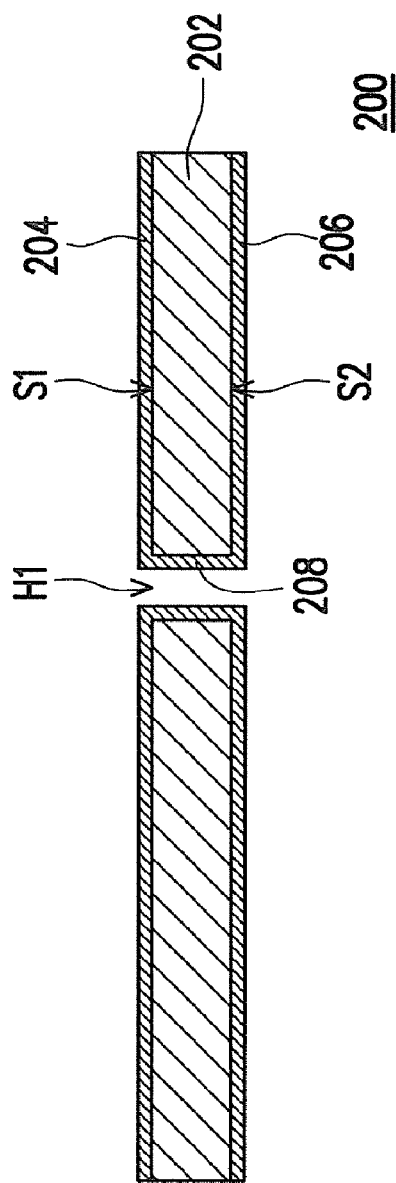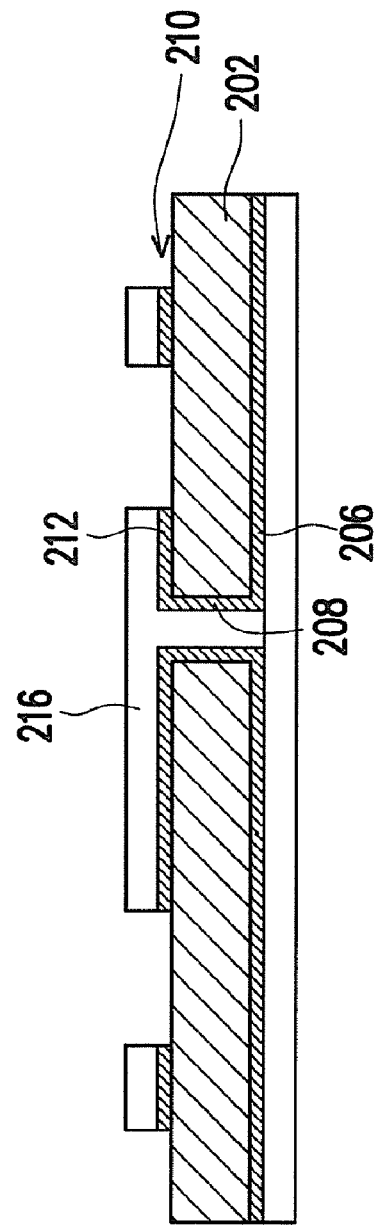
FIG. 2A
FIG. 2B

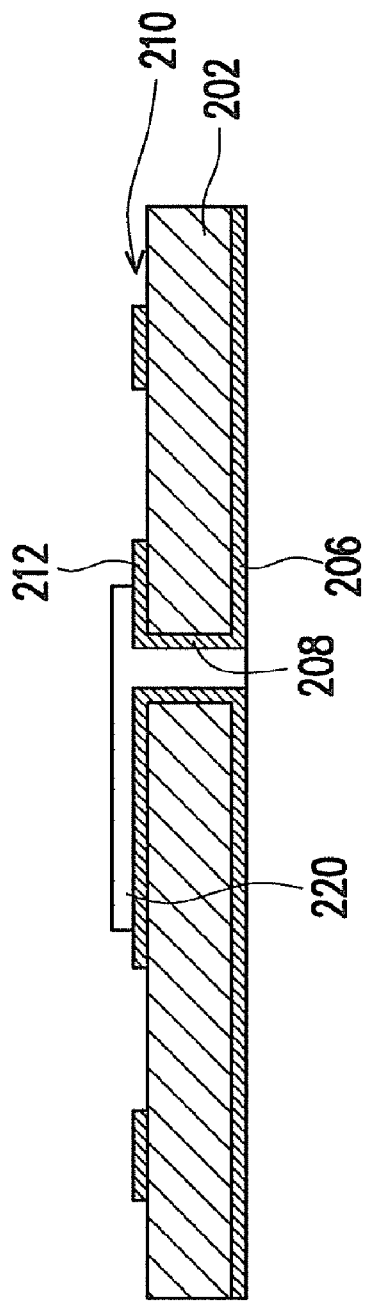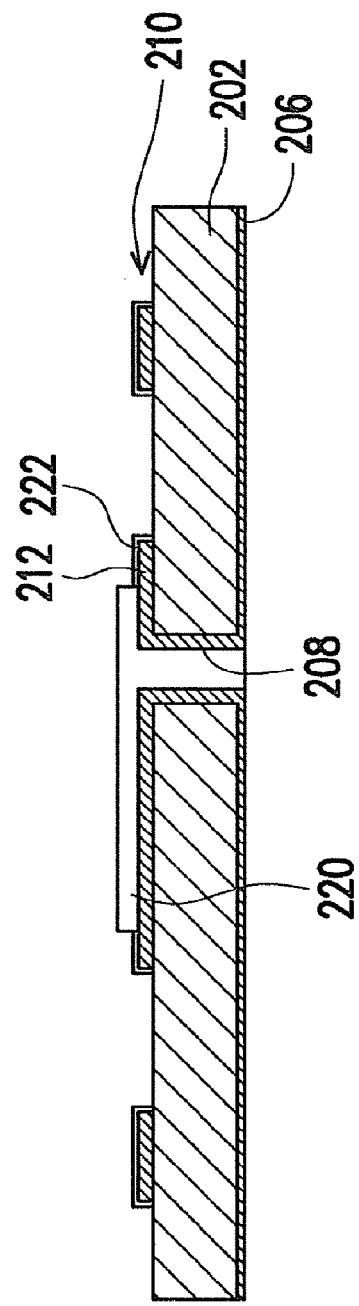
FIG. 2C
FIG. 2D

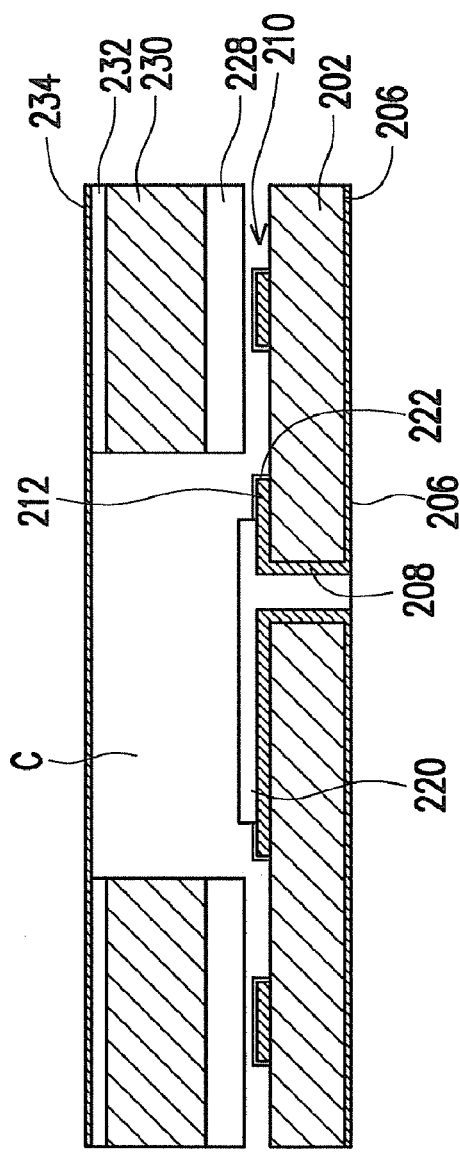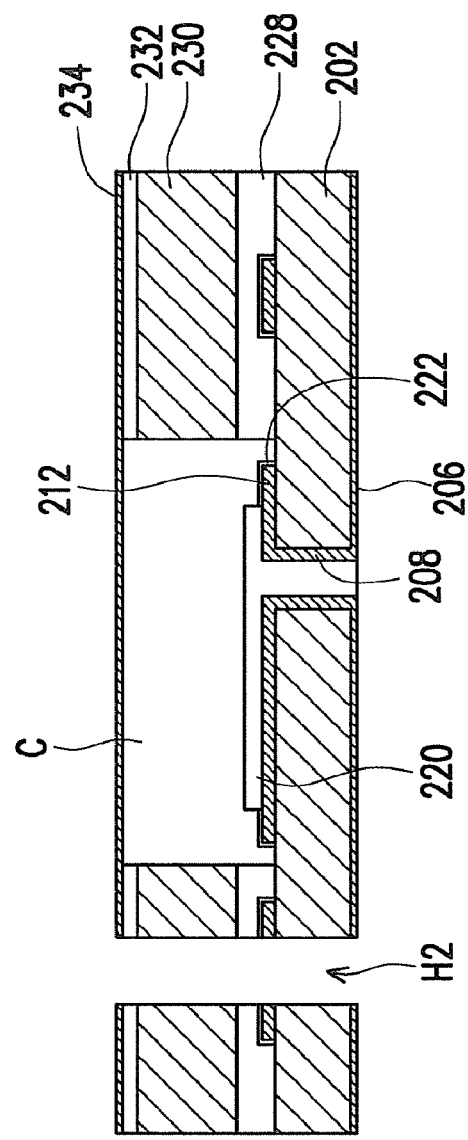

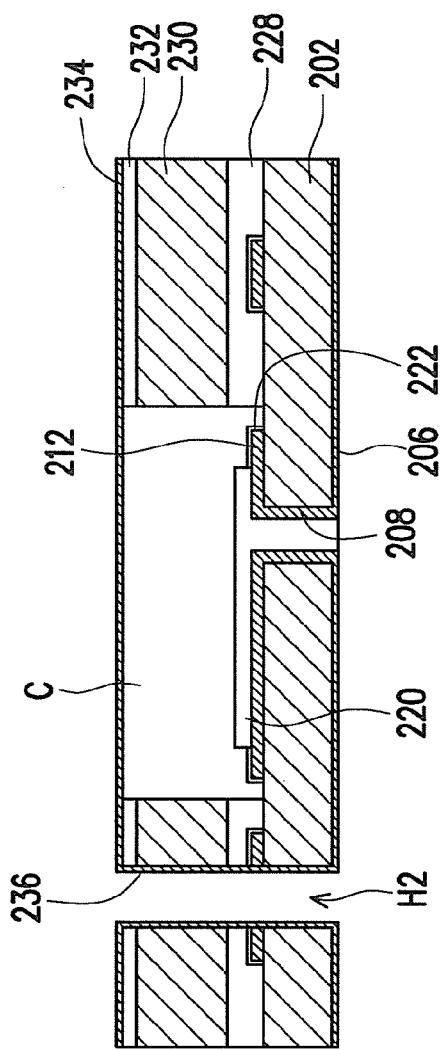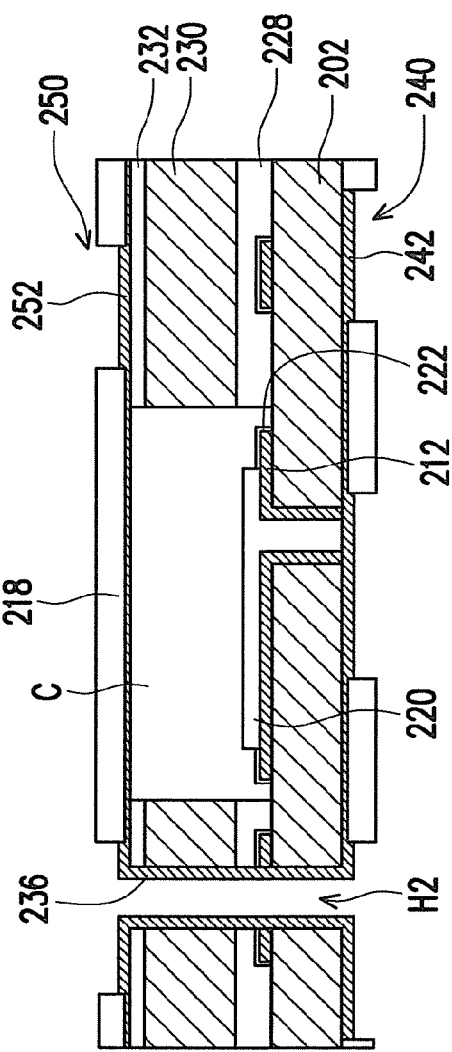

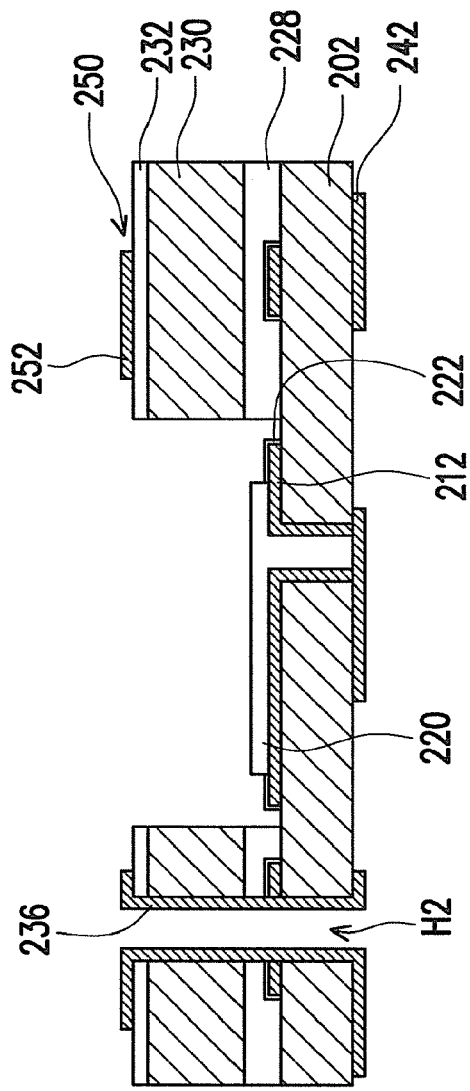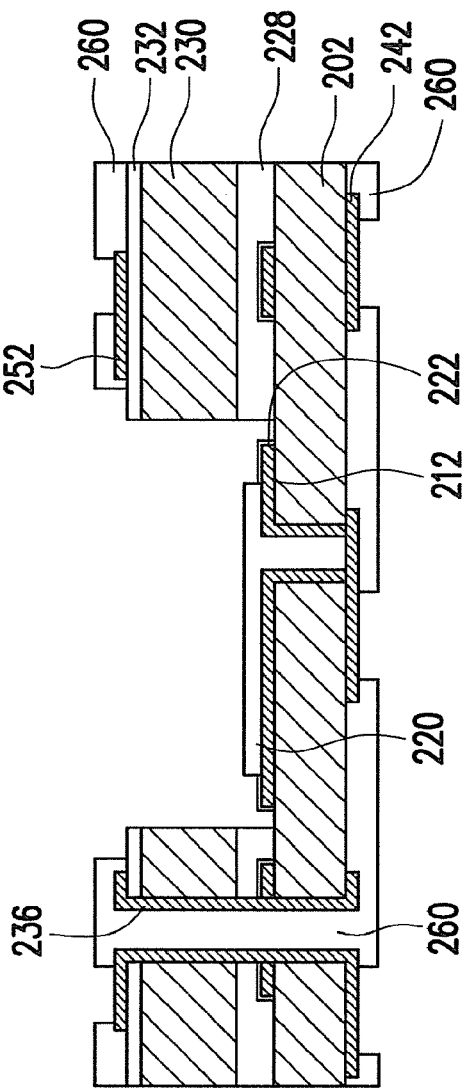

CIRCUIT BOARD PROCESS

CROSS-REFERENCE TO RELATED APPLICATION

This application claims the priority benefit of Taiwan application serial no. 97119946, filed May 29, 2008. The entirety of the above-mentioned patent application is hereby incorporated by reference herein and made a part of specification.

BACKGROUND OF THE INVENTION

1. Field of the Invention

The present invention relates to a circuit board process, and more particularly, to a process for manufacturing a circuit board having a cavity.

2. Description of Related Art

As shown in FIG. 1, a conventional chip package structure 100 having a cavity mainly includes a carrier 110, a first chip 120, a second chip 130, and a molding encapsulant 140. The carrier 110 is usually composed of a substrate 111 and a heat dissipating plate 112. The substrate 111 has an upper surface 113, a bottom surface 114, and an opening 115. The heat dissipating plate 112 is adhered to the bottom surface 114 of the substrate 111, such that the opening 115 of the substrate 111 can act as the cavity capable of accommodating the chips. A plurality of first pads 116 and a plurality of second pads 117 are disposed on the upper surface 113 of the substrate 111. The first chip 120 is electrically connected to the first pads 116 via a plurality of first conductive wires 150. The second chip 130 is adhered to the first chip 120 and electrically connected to the second pads 117 through a plurality of second conductive wires 160. The molding encapsulant 140 covers the first chip 120 and the second chip 130 and encapsulates the first conductive wires 150 and the second conductive wires 160.

Note that the first pads 116 and the second pads 117 are disposed on the same surface of the substrate 111. Hence, wire-bonding heights of the first conductive wires 150 and the second conductive wires 160 must be precisely controlled, so as to prevent the occurrence of short circuit due to excessively close wire-bonding distance or due to a molding flow affecting the wires during a process of molding the encapsulant. Besides, the second chip 130 is at a higher level than the upper surface 113 of the substrate 111, and the wire-bonding height of the second conductive wires 160 is exaggerated, thus giving rise to an increase in the thickness of the chip package structure 100.

SUMMARY OF THE INVENTION

The present invention is directed to a circuit board process in which a first circuit layer having a plurality of first pads is formed on a first substrate, and a third circuit layer having a plurality of third pads is formed on a second substrate. The first pads and the third pads are not on a same plane for wire bonding, so as to reduce interference between the conductive wires.

The present invention is directed to a circuit board process in which a first substrate and a second substrate are stacked to form a cavity for accommodating a plurality of chips. The top of the cavity is covered by a metal layer.

The present invention is directed to a circuit board process suitable for accommodating a plurality of stacked chips in a cavity of the circuit board or being applied to a package on package (POP) structure.

The present invention provides a circuit board process which comprises following steps. A first substrate is provided. Here, the first substrate has a base, a first metal layer, a second metal layer, and at least a first conductive structure passing through the base and electrically connected to the first metal layer and the second metal layer. The first metal layer is disposed on a first surface of the base, while the second metal layer is disposed on a second surface of the base. The first metal layer is then patterned for forming a first circuit layer having a plurality of first pads. Next, a first solder mask is formed on the first circuit layer and in the first conductive structure, and bonding surfaces of the first pads are exposed. After that, a roughening process is performed on the bonding surfaces of the first pads, so as to form a roughened layer. A second substrate, at least an insulation layer, and a third metal layer are then provided. Here, the second substrate and the insulation layer have a common opening, and the third metal layer covers the common opening. Thereafter, the second substrate and the insulation layer are laminated on the first surface of the base. The first solder mask and the first pads are disposed in the common opening.

According to an embodiment of the present invention, the back-end circuit board process further includes forming at least a second conductive structure that passes through the first substrate and the second substrate and is electrically connected to the second metal layer and the third metal layer.

According to an embodiment of the present invention, the back-end circuit board process further includes electroplating the second metal layer for forming a second circuit layer having a plurality of second pads and electroplating the third metal layer for forming a third circuit layer having a plurality of third pads.

According to an embodiment of the present invention, the back-end circuit board process further includes removing a portion of the third metal layer, wherein said portion of the third metal layer is located above the common opening.

According to an embodiment of the present invention, the back-end circuit board process further includes forming a second solder mask on the second circuit layer, in the second conductive structure, and on the third circuit layer and exposing the second pads and the third pads.

According to an embodiment of the present invention, the back-end circuit board process further includes forming a first passivation layer on the bonding surfaces of the first pads, forming a second passivation layer on bonding surfaces of the second pads, and forming a third passivation layer on bonding surfaces of the third pads.

According to an embodiment of the present invention, the step of performing the roughening process includes conducting a black oxidation treatment for forming the roughened layer, and the roughened layer is a black oxide layer. According to another embodiment of the present invention, the step of performing the roughening process includes conducting a brown oxidation treatment for forming the roughened layer, and the roughened layer is a brown oxide layer.

In the circuit board process of the present invention, the first substrate and the second substrate are stacked to form the cavity capable of accommodating the chips. In addition, because of the disposition of the metal layer that covers the cavity, no additional mask is required for preventing contamination caused by impurities, pollutants, electroplating solutions, or solvents. Further, the entire manufacturing process can be simplified according to the present invention.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 2F are schematic flowcharts illustrating a front-end circuit board process according to an embodiment of the present invention.

FIGS. 2G through 2K are schematic flowcharts illustrating a back-end circuit board process according to the embodiment of the present invention.

DESCRIPTION OF EMBODIMENTS

Figure 1:
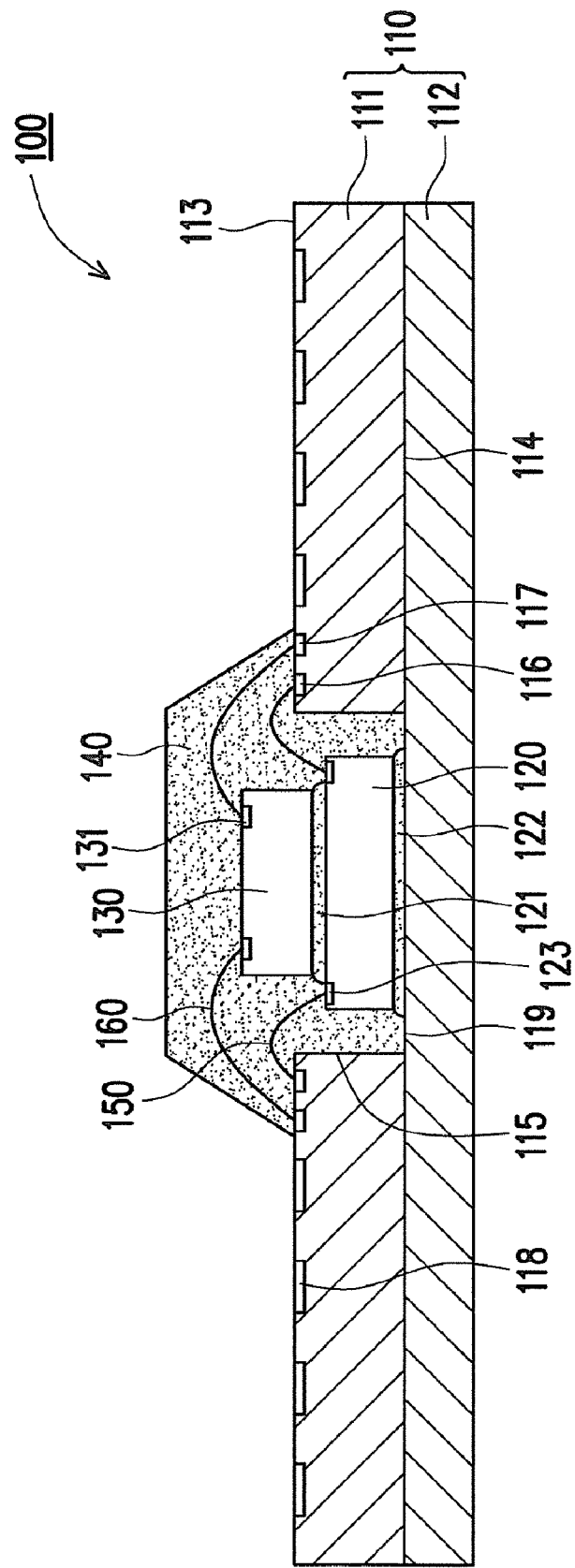
FIG. 1 is a schematic view illustrating a conventional chip package structure having a cavity.

FIGS. 2A through 2F are schematic flowcharts illustrating a front-end circuit board process according to an embodiment of the present invention, while FIGS. 2G through 2K are schematic flowcharts illustrating a back-end circuit board process according to an embodiment of the present invention. Referring to the embodiment illustrated in FIGS. 2A and 2B, a first substrate 200 is provided at first. The first substrate 200 has a base 202, a first metal layer 204, a second metal layer 206, and a first conductive structure 208 passing through the base 202 and electrically connected to the first metal layer 204 and the second metal layer 206. The first metal layer 204 is disposed on a first surface S1 of the base 202, while the second metal layer 206 is disposed on a second surface S2 of the base 202. Secondly, the first metal layer 204 is patterned to form a first circuit layer 210 having a plurality of first pads 212.

The first substrate 200 is a multi-layer circuit substrate, such as a two-layer circuit substrate, a four-layer circuit substrate, or a six-layer circuit substrate. The first metal layer 204 and the second metal layer 206 are formed by electroplating copper or laminating copper foil onto the base 202. The base 202 not only can serve as an insulated core base, but also can have built-up circuits or laminated circuits in which the insulation material is laminated. The first conductive structure 208 is usually formed by first implementing a laser drilling or a mechanical drilling and then performing an electroplating process or filling a conductive paste to form a conductive layer on a wall of a through hole H1. Besides, the first conductive structure 208 is electrically connected to the first metal layer 204 and the second metal layer 206 for electrical transmission.

In FIG. 2B, a photoresist 216 is coated onto the first metal layer 204, for example. A patterning process including exposure, development, and etching steps is then carried out to form the first circuit layer 210 having the first pads 212. The photoresist 216 can be a photo-sensitive material, such as a dry film or a liquid photoresist. After the implementation of the patterning process, the photoresist 216 may be removed by performing a lift-off process or by applying solvents.

Thirdly, referring to the embodiment illustrated in FIGS. 2C and 2D, a first solder mask 220 is formed on the first circuit layer 210 and in the first conductive structure 208, and bonding surfaces of the first pads 212 are exposed. Fourthly, a roughening process is performed on the bonding surfaces of the first pads 212 to form a roughened layer 222. The roughened layer 222 is, for example, copper oxide or copper monoxide which is black oxidized and formed on a surface of copper (i.e. a black oxide layer), or an organic complex compound which is brown oxidized and formed on a surface of copper (i.e. a brown oxide layer). Prior to the implementation of the roughening process, the second metal layer 206 can be further thinned down by polishing and flash etching. The first solder mask 220 is, for example, formed by stencil printing or spin coating, so as to perform a solder-resistance function and to prevent the circuits from being oxidized. A portion of the first circuit layer 210 which is not covered by the first solder mask 220 is protected by the roughened layer 222, and the roughness of a surface of said portion of the first circuit layer 210 is enhanced, further resulting in the superior adhesion.

Fifthly, referring to the embodiment depicted in FIGS. 2E and 2F, a second substrate 230, two insulation layers 228 and 232, and a third metal layer 234 are provided. The second substrate 230 and the two insulation layers 228 and 232 have a common opening C that is covered by the third metal layer 234, so as to form a cavity. Sixthly, the second substrate 230 is laminated onto the first surface S1 of the first substrate 200 through the insulation layer 228, such that the first solder mask 220 and the first pads 212 are located within the common opening C.

As shown in FIG. 2E, prior to the lamination, the second substrate 230 and the two insulation layers 228 and 232 are partially removed with use of laser beams or a manufacturing machine to form the common opening C having a predetermined dimension. Next, the third metal layer 234 is closely adhered to a surface of the second substrate 230 through the insulation layer 232, while the other surface of the second substrate 230 is closely adhered to the first surface S1 of the base 202 through the insulation layer 228. Posterior to the lamination, the first solder mask 220 and the first pads 212 are disposed in the common opening C and are not covered by the insulation layer 228. The second substrate 230 is, for example, made of FR-4, FR-5, or bismaleimide-triazine (BT), while the two insulation layers 228 and 232 are made of a prepreg or other adhesives.

In the aforesaid roughening process, the roughened layer 222 is formed on the surface of the first circuit layer 210 and is closely bonded to the insulation layer 228. Thereby, adhesion between the first substrate 200 and the second substrate 230 is enhanced, and so is the adhesion of the first pads. Besides, since the third metal layer 234 covers the common opening C, the third metal layer 234 serving as a mask is able to prevent impurities, pollutants, electroplating solutions, or solvents from entering into the common opening C in the subsequent processes of drilling, electroplating, and patterning. Hence, no additional mask is required. Further, the entire manufacturing process can be simplified.

Please refer to the embodiment depicted in FIGS. 2G through 2I in which the back-end circuit board process is elaborated. Note that the present invention does not pose any limitation on the back-end circuit board process. Seventhly, a second conductive structure 236 passing through the first substrate 200 and the second substrate 230 and electrically connected to the second metal layer 206 and the third metal layer 234 is formed. Eighthly, the second metal layer 206 is electroplated to form a second circuit layer 240 having a plurality of second pads 242. The third metal layer 234 is also electroplated to form a third circuit layer 250 having a plurality of third pads 252. As shown in FIG. 2G, the second conductive structure 236 is usually formed by first implementing the laser drilling or the mechanical drilling and then performing the electroplating process or filling the conductive paste to form the conductive layer on the wall of the through hole H1. Besides, the second conductive structure 236 is electrically connected to the second metal layer 206 and the third metal layer 234 for electrical transmission. Thereafter, a photoresist 218 depicted in FIG. 2H is coated onto the second metal layer 206 and the third metal layer 234, and the patterning process including the exposure and development steps are then carried out. The second metal layer 206 and the third metal layer 234 are then used as electroplating seed layers for forming required circuit patterns on the second metal layer 206 and the third metal layer 234. After that, the photoresist 218 depicted in FIG. 2H is removed, and an etching process is thoroughly performed. As indicated in FIG. 2I, a flash etching process is implemented on the exposed second metal layer 206 and the exposed third metal layer 234. Here, only the patterned second circuit layer 240 and the patterned third circuit layer 250 remain.

It should be noted that a portion of the third metal layer 234 is located above the common opening C. After the flash etching process is carried out, said portion of the third metal layer 234 is removed, and thereby the common opening C is exposed. The common opening C can serve as the cavity of the chip package structure, which is further elaborated in the following embodiment.

Figure 2K:
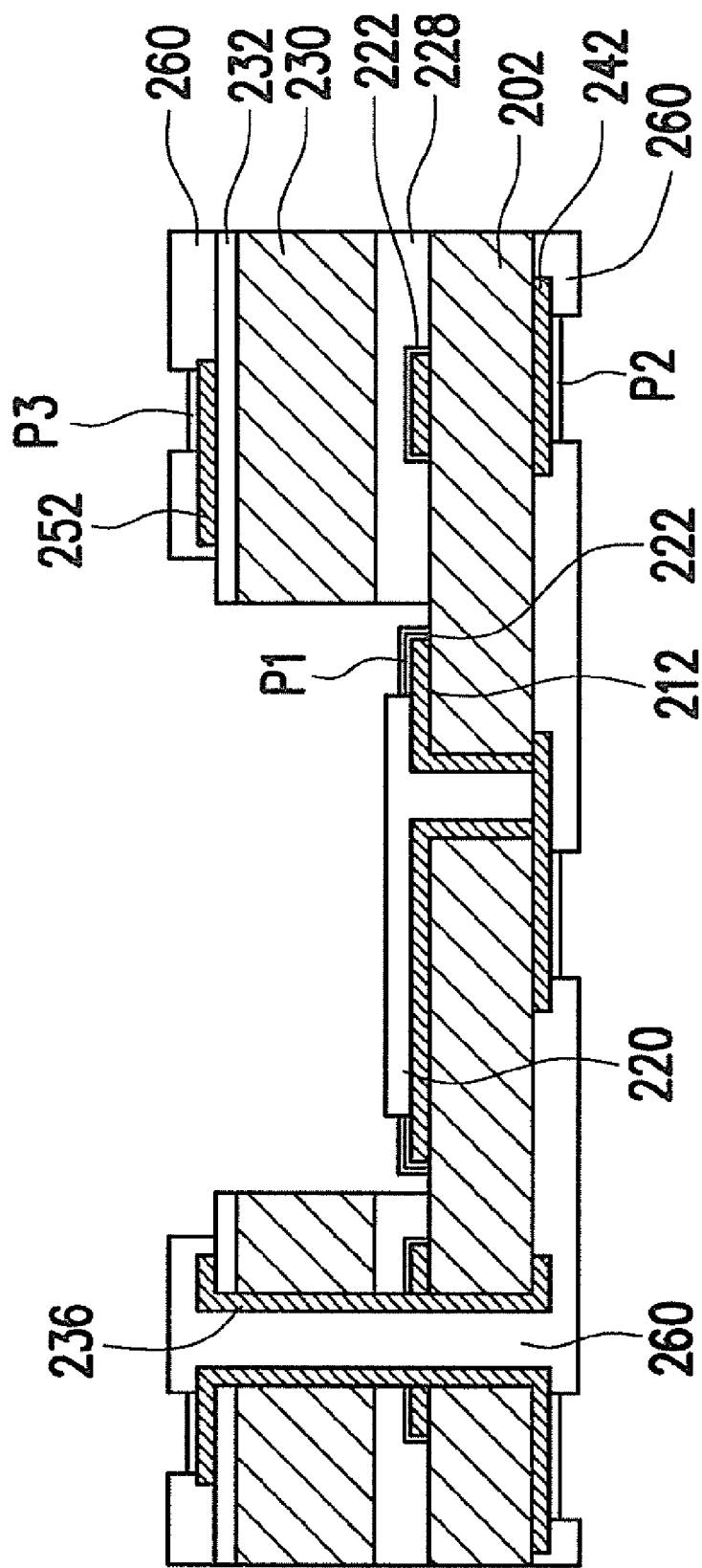

Ninthly, referring to the embodiment depicted in FIGS. 2J and 2K, a second solder mask 260 is formed on the second circuit layer 240, in the second conductive structure 236, and on the third circuit layer 250, while the second pads 242 and the third pads 252 are exposed. Tenthly, a first passivation layer P1 is formed on the bonding surfaces of the first pads 212, a second passivation layer P2 is formed on bonding surfaces of the second pads 242, and a third passivation layer P3 is formed on bonding surfaces of the third pads 252. The second solder mask 260 is, for example, formed by stencil printing or spin coating, so as to perform the solder-resistance function and to prevent the circuits from being oxidized. The first passivation layer P1, the second passivation layer P2, and the third passivation layer P3 are, for example, made of an anti-oxidant, such as a nickel gold alloy, tin, an organic solderability preservation (OSP), and so forth. Thereby, the copper is not oxidized, and bonding strengths between the pads and solder balls, bumps, or conductive wires can be enhanced.

Figure 3:
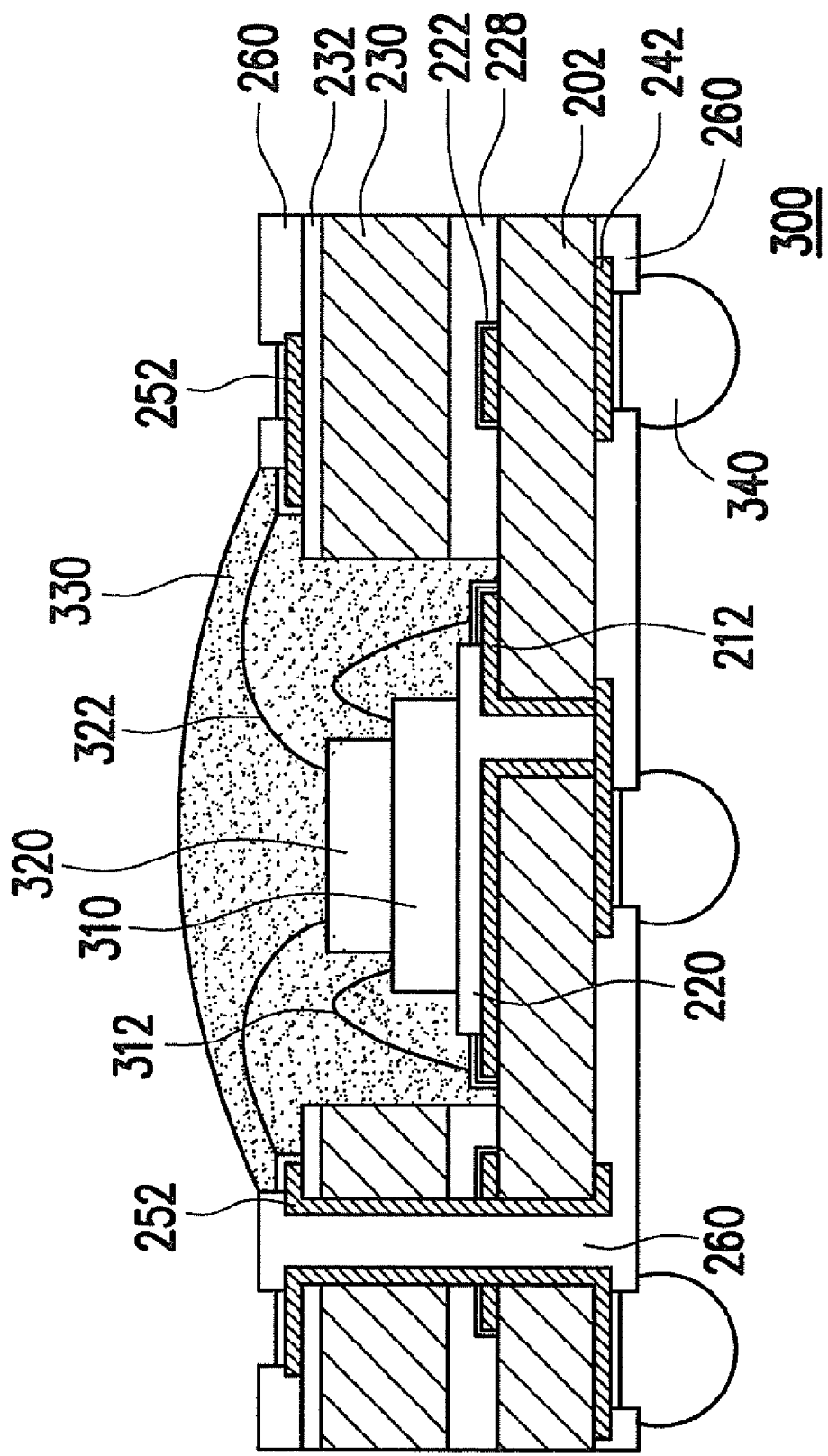
FIG. 3 is a schematic view of a multi-chip package structure according to an embodiment of the present invention.

A schematic view of a chip package structure in which the aforesaid circuit board is disposed is provided hereinafter. As shown in FIG. 3, a multi-chip package structure 300 has a first chip 310 and a second chip 320 that are stacked to each other and disposed in a cavity (the common opening). The first chip 310 is electrically connected to the first pads 212 via a plurality of first conductive wires 312. The second chip 320 is adhered to the first chip 310 and is electrically connected to the third pads 252 via a plurality of second conductive wires 322. A molding encapsulant 330 covers the first chip 310 and the second chip 320 in the cavity and encapsulates the first conductive wires 312 and the second conductive wires 322 for the purpose of protection. A plurality of solder balls 340 are disposed on the second pads 242 for transmitting signals from the first and the second chips 310 and 320 to an external electronic device.

In comparison with a conventional multi-chip package structure, the second chip 320 is at a lower level than an upper surface of the second substrate 230, and the wire-bonding height of the second conductive wires 322 can be lowered down, thus giving rise to a decrease in the entire thickness of the chip package structure 300. In addition, the first pads 212 positioned on the first substrate 200 and the third pads 252 positioned on the second substrate 230 are disposed at a distance, and therefore the wire-bonding height of the first conductive wires 312 poses no limitation on the second conductive wires 322 disposed above the first conductive wires 312. As such, the occurrence of short circuit due to the excessively close wire-bonding distance between the first conductive wires 312 and the second conductive wires 322 and due to a molding flow affecting the wires during a process of molding the encapsulant can be prevented, and the reliability of the multi-chip package structure 300 can be further improved.

Figure 4:
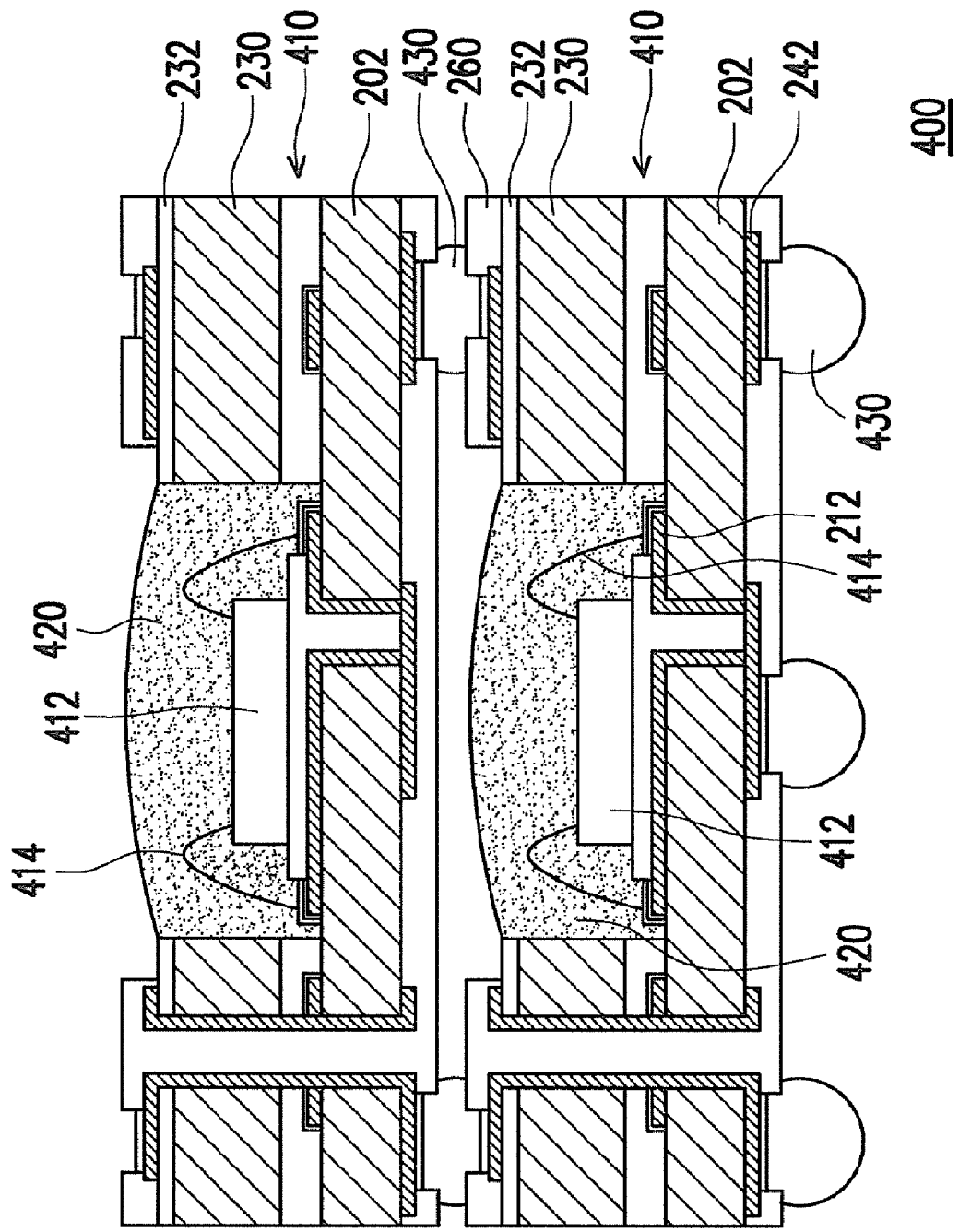
FIG. 4 is a schematic view of a stacked multi-chip package structure according to an embodiment of the present invention.

After that, referring to FIG. 4, a stacked multi-chip package structure 400 has two chip package structures 410 stacked to each other. Each of the chip package structures 410 has one chip 412 disposed in the cavity and electrically connected to the first pads 212 on the base 202 via a plurality of first conductive wires 414. A molding encapsulant 420 covers the first chip 412 in the cavity and encapsulates the first conductive wires 414 for the purpose of protection. A plurality of solder balls 430 are disposed on the second pads 242 and electrically connected between the two chip package structures 410, so as to transmit signals from the two chips 412 to an external electronic device.

In light of the foregoing, according to the circuit board process of the present invention, the first substrate and the second substrate are stacked to form the cavity capable of accommodating the chips. In addition, because of the disposition of the metal layer that covers the cavity, no additional mask is required for preventing contamination caused by the impurities, the pollutants, the electroplating solutions, or the solvents. Further, the entire manufacturing process can be simplified according to the present invention. Moreover, the circuit board of the present invention is equipped with the cavity able to accommodate a plurality of chips and to precisely control the wire-bonding heights of the second conductive wires, such that the entire thickness of the chip package structure can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A circuit board process, comprising:
providing a first substrate having a base, a first metal layer, a second metal layer, and at least a first conductive structure passing through the base and electrically connected to the first metal layer and the second metal layer, wherein the first metal layer is disposed on a first surface of the base, and the second metal layer is disposed on a second surface of the base;
patterning the first metal layer to form a first circuit layer having a plurality of first pads;
forming a first solder mask on the first circuit layer and in the first conductive structure and exposing bonding surfaces of the first pads;
performing a roughening process on the bonding surfaces of the first pads, so as to form a roughened layer;
providing a second substrate, at least an insulation layer, and a third metal layer, wherein the second substrate and the insulation layer have a common opening, and the third metal layer covers the common opening; and
laminating the second substrate and the insulation layer on the first surface of the base, wherein the first solder mask and the first pads are disposed in the common opening.
2. The circuit board process as claimed in claim 1, further comprising forming at least a second conductive structure passing through the first substrate and the second substrate and electrically connected to the second metal layer and the third metal layer.

3. The circuit board process as claimed in claim 2, further comprising:
electroplating the second metal layer to form a second circuit layer having a plurality of second pads; and
electroplating the third metal layer to form a third circuit layer having a plurality of third pads.

4. The circuit board process as claimed in claim 3, further comprising removing a portion of the third metal layer, wherein said portion of the third metal layer is located above the common opening.

5. The circuit board process as claimed in claim 3, further comprising forming a second solder mask on the second circuit layer, in the second conductive structure, and on the third circuit layer and exposing the second pads and the third pads.

6. The circuit board process as claimed in claim 3, further comprising:
forming a first passivation layer on the bonding surfaces of the first pads;
forming a second passivation layer on bonding surfaces of the second pads; and
forming a third passivation layer on bonding surfaces of the third pads.

7. The circuit board process as claimed in claim 1, wherein the insulation layer is a prepreg.

8. The circuit board process as claimed in claim 6, wherein a material of the first passivation layer, the second passivation layer, and the third passivation layer comprises a nickel gold alloy.

9. The circuit board process as claimed in claim 1, wherein the step of performing the roughening process comprises conducting a black oxidation treatment to form the roughened layer, and the roughened layer is a black oxide layer.

10. The circuit board process as claimed in claim 1, wherein the step of performing the roughening process comprises conducting a brown oxidation treatment to form the roughened layer, and the roughened layer is a brown oxide layer.

* * * * *